United States Patent
Ide et al.

(10) Patent No.: US 9,812,345 B2
(45) Date of Patent: *Nov. 7, 2017

(54) COMPOSITE SUBSTRATE, SEMICONDUCTOR DEVICE, AND METHOD FOR MANUFACTURING SEMICONDUCTOR DEVICE

(71) Applicant: NGK INSULATORS, LTD., Aichi (JP)

(72) Inventors: Akiyoshi Ide, Kasugai (JP); Tatsuro Takagaki, Nagoya (JP); Sugio Miyazawa, Kasugai (JP); Yuji Hori, Owariasahi (JP); Tomoyoshi Tai, Inazawa (JP); Ryosuke Hattori, Ichinomiya (JP)

(73) Assignee: NGK INSULATORS, LTD., Aichi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/825,715

(22) Filed: Aug. 13, 2015

(65) Prior Publication Data

US 2015/0380290 A1    Dec. 31, 2015

Related U.S. Application Data

(63) Continuation of application No. PCT/JP2014/053689, filed on Feb. 18, 2014.

(30) Foreign Application Priority Data

Feb. 19, 2013    (JP) ................................. 2013-030161

(51) Int. Cl.
  *H01L 21/683*    (2006.01)
  *B32B 38/10*    (2006.01)
  (Continued)

(52) U.S. Cl.
  CPC ............ *H01L 21/6835* (2013.01); *B32B 7/02* (2013.01); *B32B 7/06* (2013.01); *B32B 7/12* (2013.01);
  (Continued)

(58) Field of Classification Search
  None
  See application file for complete search history.

(56) References Cited

U.S. PATENT DOCUMENTS 7,205,211 B2    4/2007 Aspar et al.
2004/0253795 A1    12/2004 Martinez et al.
(Continued)

FOREIGN PATENT DOCUMENTS

CN    101689841 A    3/2010
CN    101849276 A    9/2010
(Continued)

OTHER PUBLICATIONS

Office Action from Chinese Patent App. No. 201480009140.3 (Dec. 13, 2016).
(Continued)

*Primary Examiner* — Jack Chen
(74) *Attorney, Agent, or Firm* — Cermak Nakajima & McGowan LLP; Tomoko Nakajima

(57) ABSTRACT

A composite substrate 10 includes a semiconductor substrate 12 and an insulating support substrate 14 that are laminated together. The support substrate 14 includes first and second substrates 14a and 14b made of the same material and bonded together with a strength that allows the first and second substrates 14a and 14b to be separated from each other with a blade. The semiconductor substrate 12 is laminated on a surface of the first substrate 14a opposite a surface thereof bonded to the second substrate 14b.

7 Claims, 3 Drawing Sheets

(51) Int. Cl.
*B32B 9/00* (2006.01)
*B32B 9/04* (2006.01)
*B32B 7/02* (2006.01)
*H03H 9/25* (2006.01)
*H03H 3/10* (2006.01)
*B32B 7/06* (2006.01)
*B32B 18/00* (2006.01)
*H01L 21/78* (2006.01)
*B32B 7/12* (2006.01)
*B32B 27/08* (2006.01)
*B32B 27/20* (2006.01)
*B32B 27/28* (2006.01)
*H01L 41/187* (2006.01)
*H03H 9/02* (2006.01)
*B32B 37/10* (2006.01)
*H03H 3/08* (2006.01)

(52) U.S. Cl.
CPC .............. *B32B 9/005* (2013.01); *B32B 9/04* (2013.01); *B32B 18/00* (2013.01); *B32B 27/08* (2013.01); *B32B 27/20* (2013.01); *B32B 27/283* (2013.01); *B32B 38/10* (2013.01); *H01L 21/78* (2013.01); *H03H 3/10* (2013.01); *H03H 9/25* (2013.01); *B32B 37/10* (2013.01); *B32B 2264/105* (2013.01); *B32B 2307/20* (2013.01); *B32B 2307/206* (2013.01); *B32B 2307/538* (2013.01); *B32B 2309/02* (2013.01); *B32B 2309/105* (2013.01); *B32B 2457/00* (2013.01); *B32B 2457/14* (2013.01); *H01L 41/1873* (2013.01); *H03H 3/08* (2013.01); *H03H 9/02574* (2013.01); *Y10T 428/12597* (2015.01)

(56) References Cited

U.S. PATENT DOCUMENTS

| | | |
|---|---|---|
| 2010/0088868 A1 | 4/2010 | Kando et al. |
| 2010/0092786 A1 | 4/2010 | Utsumi et al. |
| 2010/0276723 A1 | 11/2010 | Utsumi et al. |
| 2015/0328875 A1* | 11/2015 | Hattori .................. B32B 38/10 310/313 R |

FOREIGN PATENT DOCUMENTS

| | | |
|---|---|---|
| JP | 10-012547 A | 1/1998 |
| JP | 2005-005708 A | 1/2005 |
| JP | 2005-302805 A | 10/2005 |
| JP | 2007-324195 A | 12/2007 |
| JP | 2009-094661 A | 4/2009 |
| JP | 2009-117707 A | 5/2009 |
| JP | 2009-164314 A | 7/2009 |

OTHER PUBLICATIONS

European Search Report for EP Patent App. No. 14754763.2 (May 23, 2016).
English language translation of the International Preliminary Report on Patentability for PCT Patent App. No. PCT/JP2014/053689 (Aug. 25, 2015).
International Search Report and Written Opinion for PCT Patent App. No. PCT/JP2014/053689 (Mar. 20, 2014) with English language translation of the Search Report.
Communication Pursuant to Article 94(3) EPC for European Patent App. No. 14754763.2 (Jun. 27, 2017).

* cited by examiner

COMPOSITE SUBSTRATE, SEMICONDUCTOR DEVICE, AND METHOD FOR MANUFACTURING SEMICONDUCTOR DEVICE

BACKGROUND OF THE INVENTION

1. Field of the Invention

The present invention relates to composite substrates, semiconductor devices, and methods for manufacturing semiconductor devices.

2. Description of the Related Art

One of the approaches for achieving high-speed, low-power semiconductor integrated circuits is to employ integrated circuit technology on composite substrates, including SOI technology (see PTL 1). Composite substrates are composed of a support substrate and a functional layer (semiconductor layer). The use of monocrystalline substrates as semiconductor layers for composite substrates provides a high-quality functional layer. In addition to monocrystalline substrates, polycrystalline substrates have also been proposed for use as support substrates for cost reduction. Examples of such composite substrates include silicon-on-insulator (SOI) wafers and silicon-on-sapphire (SOS) wafers for radio-frequency components for cellular phones. With the recent trend toward miniaturization, the development of low-profile radio-frequency devices is becoming more important. Unfortunately, it is known that composite substrates, which are composed of different materials bonded together, are more prone to warpage as they become thinner, which causes problems with device fabrication. Accordingly, backgrinding has recently been employed, in which all functions are implemented on the semiconductor layer before the support substrate is ground to the desired thickness.

CITATION LIST

Patent Literature

PTL 1: JP 10-12547 A

SUMMARY OF THE INVENTION

Unfortunately, the grinding of hard materials such as sapphire involves considerable wear of grinding wheels, which contributes to increased cost.

In view of the foregoing problems, a primary object of the present invention is to eliminate the need for backgrinding during the manufacture of semiconductor devices.

To achieve the foregoing primary object, the present invention employs the following solutions.

A composite substrate according to the present invention includes a semiconductor substrate and an insulating support substrate that are laminated together. The support substrate includes first and second substrates made of the same insulating material and bonded together with a strength that allows the first and second substrates to be separated from each other with a blade. The semiconductor substrate is laminated on a surface of the first substrate opposite a surface thereof bonded to the second substrate.

A method for manufacturing a semiconductor device according to the present invention includes the steps of:
(a) providing the above composite substrate;
(b) forming a CMOS semiconductor structure on the semiconductor substrate of the composite substrate;
(c) separating and removing the second substrate from the first substrate with a blade; and
(d) dicing the composite substrate to obtain a semiconductor device.

A semiconductor device according to the present invention is manufactured by the above method for manufacturing a semiconductor device according to the present invention.

The composite substrate according to the present invention includes a support substrate including first and second substrates made of the same insulating material and bonded together with a strength that allows the first and second substrates to be separated from each other with a blade. The support substrate is thus thicker than if the first substrate is used alone as the support substrate. This reduces the warpage of the composite substrate due to temperature changes and also increases the strength of the composite substrate. After a CMOS semiconductor structure is formed on the semiconductor substrate, the second substrate can be separated and removed from the first substrate with a blade. The thickness of the support substrate can thus be easily reduced. This results in a lower cost than if the thickness of a thick support substrate is reduced by backgrinding and therefore results in reduced manufacturing costs of semiconductor devices. The removed second substrate can be reused for the fabrication of the composite substrate according to the present invention, which also contributes to reduced cost.

The method for manufacturing a semiconductor device according to the present invention includes providing the above composite substrate according to the present invention, forming a CMOS semiconductor structure on the semiconductor substrate of the composite substrate, separating and removing the second substrate from the first substrate with a blade, and dicing the composite substrate to obtain a semiconductor device. After the CMOS semiconductor structure is formed, the second substrate can be separated and removed from the first substrate with a blade. The thickness of the support substrate can thus be easily reduced. This results in a lower cost than if the thickness of a thick support substrate is reduced by backgrinding and therefore results in reduced manufacturing costs of semiconductor devices.

DESCRIPTION OF THE PREFERRED EMBODIMENTS

Figure 1:
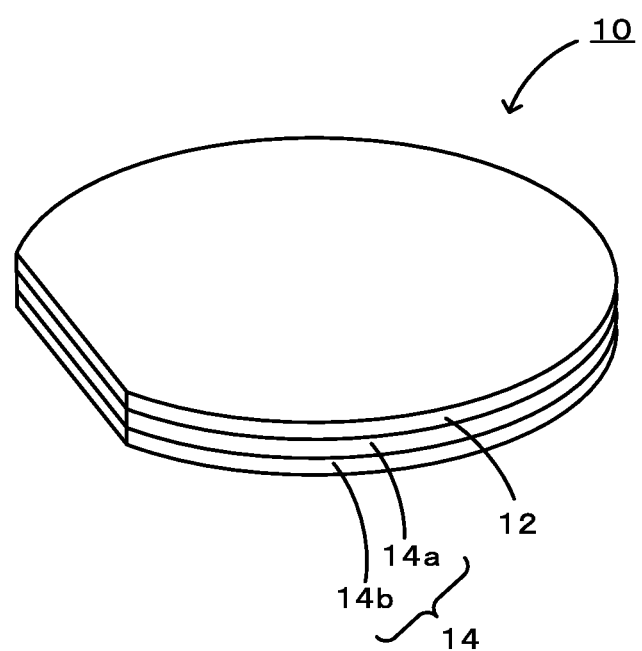
FIG. 1 is a schematic sectional view of a composite substrate 10.

An embodiment of the present invention will now be described with reference to the drawings. FIG. 1 is a schematic sectional view of a composite substrate 10 according to this embodiment. The composite substrate 10 includes a semiconductor substrate 12 and a support substrate 14.

The semiconductor substrate 12 is a substrate on which semiconductor structures can be fabricated. Examples of materials for the semiconductor substrate 12 include silicon, specifically, n-type silicon and p-type silicon. Germanium and compound semiconductors such as GaN and GaAs can also be used. The semiconductor substrate 12 is not limited to any particular size. For example, the semiconductor substrate 12 may have a diameter of 50 to 150 mm and a thickness of 0.2 to 50 µm.

The support substrate 14 is an insulating substrate bonded to the back surface of the semiconductor substrate 12 directly or with an organic adhesive layer therebetween. The support substrate 14 includes first and second substrates 14a and 14b made of the same insulating material and bonded together, directly or with an organic adhesive layer therebetween, with a strength that allows the first and second substrates 14a and 14b to be separated from each other with a blade. The support substrate 14 is bonded to the semiconductor substrate 12 on the surface of the first substrate 14a opposite the surface thereof bonded to the second substrate 14b. Examples of materials for the support substrate 14 include silicon, sapphire, alumina, silicon nitride, aluminum nitride, and silicon carbide. Sapphire, alumina, and aluminum nitride are preferred for radio-frequency applications, which require high volume resistance. Polycrystalline alumina is preferred for cost reduction. Transparent alumina, which has high purity and density, is preferred to achieve both direct bonding to semiconductor substrates and reduced wafer cost and to reduce the contamination level of the wafer surface (e.g., to $10 \times 10^{10}$ atms/cm$^2$ or less). The support substrate 14 has, for example, a diameter of 50 to 300 mm and a thickness of 200 to 1,200 µm. The first and second substrates 14a and 14b have, for example, a diameter of 50 to 300 mm and a thickness of 100 to 600 µm.

A method for manufacturing the composite substrate 10 will now be described with reference to FIG. 2. FIG. 2 shows schematic sectional views of a process for manufacturing the composite substrate 10.

Figure 2A:
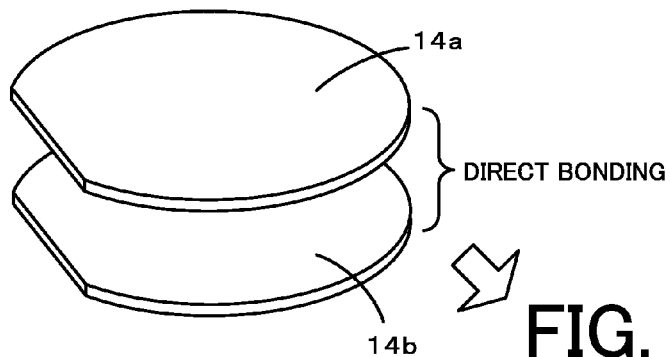
FIGS. 2A-2D show schematic sectional views of a process for manufacturing the composite substrate 10.
Figure 2B:
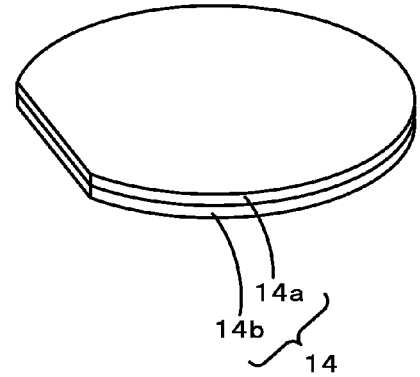

First and second substrates 14a and 14b that are disc-shaped and made of the same insulating material are provided first (see FIG. 2A). The two substrates 14a and 14b are directly bonded together to fabricate the support substrate 14 (see FIG. 2B). The two substrates 14a and 14b can be directly bonded together, for example, by the following process. The surfaces of the two substrates 14a and 14b to be bonded are first cleaned to remove any contaminants therefrom. The surfaces of the two substrates 14a and 14b to be bonded are then irradiated with an ion beam of an inert gas such as argon to remove any residual impurities (e.g., oxide film and adsorbate) and to activate the surfaces to be bonded. The two substrates 14a and 14b are then laminated together in a vacuum at room temperature. The two substrates 14a and 14b are bonded with a strength that allows them to be separated from each other when a blade having a thickness of 100 µm is inserted therebetween. To achieve such a strength, parameters such as the surface roughness of the surfaces to be bonded, the time for ion beam irradiation, and the pressure applied during lamination are experimentally determined. For example, if the two substrates 14a and 14b are both silicon substrates, the Si—Si binding energy between the two substrates 14a and 14b is controlled to a level below the bulk strength of silicon, which is typically 2 to 2.5 J/m$^2$, for example, to 0.05 to 0.6 J/m$^2$. If the Si—Si binding energy between the two substrates 14a and 14b falls below 0.05 J/m$^2$, they might be separated from each other during the manufacture of semiconductor devices. If the Si—Si binding energy between the two substrates 14a and 14b exceeds 0.6 J/m$^2$, it might be impossible to smoothly insert a blade therebetween. If the surfaces of the two substrates 14a and 14b to be bonded have a surface roughness Ra of about 1 nm, a bonding strength that allows separation, i.e., 0.05 to 0.6 J/m$^2$, can be achieved by performing ion beam irradiation for a shorter period of time than for the bonding of mirror surfaces. If the surfaces of the two substrates 14a and 14b to be bonded have a surface roughness Ra of about 100 nm, a bonding strength that allows separation can be achieved under the same bonding conditions as for the bonding of mirror surfaces. In place of ion beam irradiation, bonding can be performed by plasma activation. For example, the surfaces of the two substrates are cleaned by ultrasonic washing to remove any residual foreign matter and are then irradiated with oxygen plasma or nitrogen plasma to activate the surfaces thereof. The two substrates can be laminated together in this state to induce self-bonding of the surfaces to be bonded. To achieve a bonding energy low enough to allow easy separation, the two substrates may be bonded together by plasma activation without performing heat treatment after bonding.

Figure 2C:
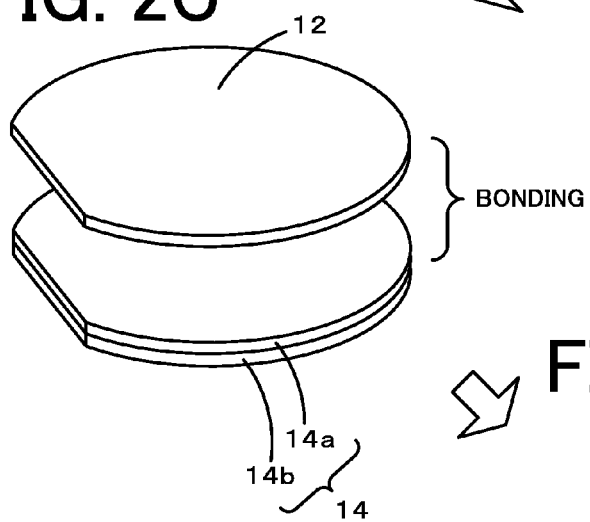
Figure 2D:
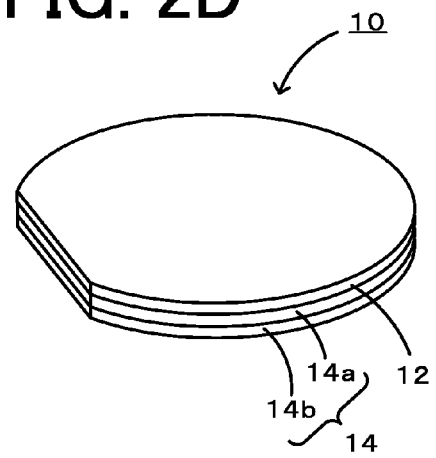

The support substrate 14 and the semiconductor substrate 12 are then bonded together (see FIG. 2C). Specifically, the surface of the first substrate 14a of the support substrate 14 and the back surface of the semiconductor substrate 12 are bonded together. The support substrate 14 and the semiconductor substrate 12 may be bonded directly or with an organic adhesive layer therebetween. Since direct bonding has been described above, a description thereof is omitted herein. It should be noted, however, that the parameters such as the surface roughness of the surfaces to be bonded, the time for ion beam irradiation, and the pressure applied during lamination are determined to achieve a bonding strength greater than or equal to the bulk strength of silicon, i.e., 2 to 2.5 J/m$^2$. To bond the support substrate 14 and the semiconductor substrate 12 with an organic adhesive layer therebetween, an organic adhesive is uniformly applied to one or both of the surface of the support substrate 14 and the back surface of the semiconductor substrate 12, and the two substrates 12 and 14 are then laminated and bonded together by hardening the organic adhesive. In this way, the composite substrate 10 is obtained (see FIG. 2D). Direct bonding may be performed in any other way, for example, using a plasma or a neutral atom beam.

A method for manufacturing semiconductor devices 30 using the composite substrate 10 will now be described with reference to FIG. 3. FIG. 3 shows schematic sectional views of a process for manufacturing the semiconductor devices 30.

Figure 3A:
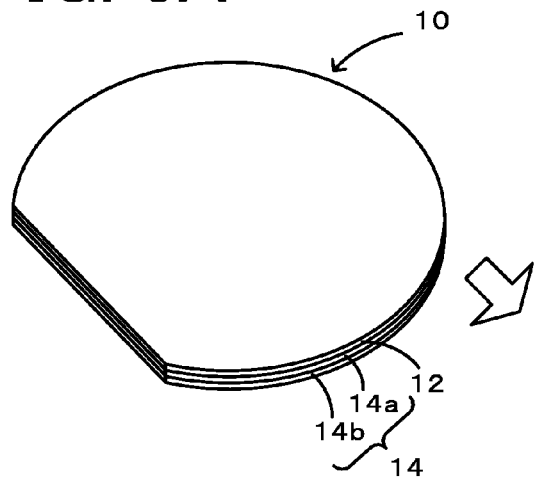
FIGS. 3A-3D show schematic sectional views of a process for manufacturing semiconductor devices 30.

The composite substrate 10 is provided first (see FIG. 3A). Since the composite substrate 10 has been described with reference to FIG. 2, a description thereof is omitted herein.

Figure 3B:
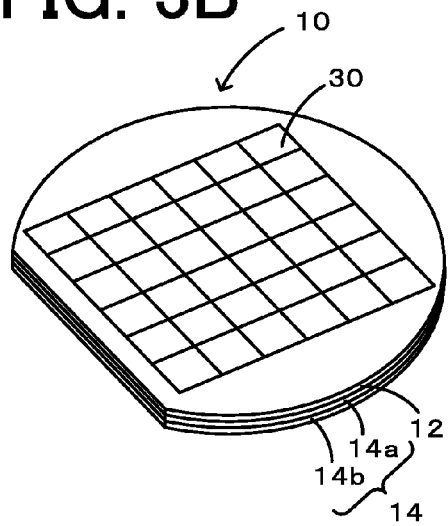

CMOS semiconductor structures and redistribution layers are then formed on the surface of the semiconductor substrate 12 of the composite substrate 10 (see FIG. 3B). The surface of the semiconductor substrate 12 is segmented such that a large number of semiconductor devices 30 are fabricated thereon. The CMOS semiconductor structures and the redistribution layers are formed in the segments corresponding to the individual semiconductor devices by photolithography.

Figure 3C:
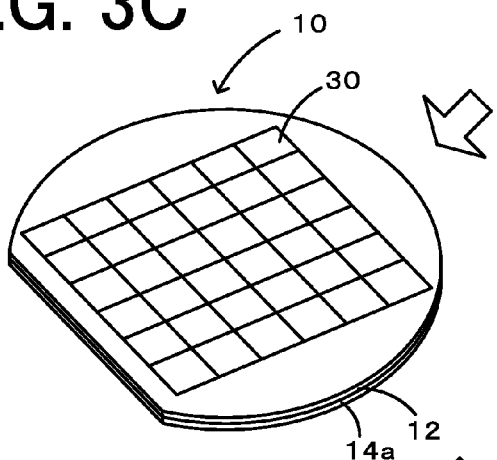

The second substrate 14b is then separated and removed from the first substrate 14a with a blade having a thickness of 100 µm (see FIG. 3C). The surface of the first substrate 14a from which the second substrate 14b has been separated (separated surface) need not be polished since it has a sufficiently small surface roughness Ra; however, it may be polished if necessary. The separated surface of the first substrate 14a contains not only elements derived from the material of the first substrate 14a, but also elements derived from the material of the vacuum chamber used for direct bonding. For example, if the material of the vacuum chamber is stainless steel, the separated surface contains elements, such as iron and chromium, derived from stainless steel. The second substrate 14b separated from the first substrate 14a can be reused for the fabrication of another composite substrate 10.

Figure 3D:
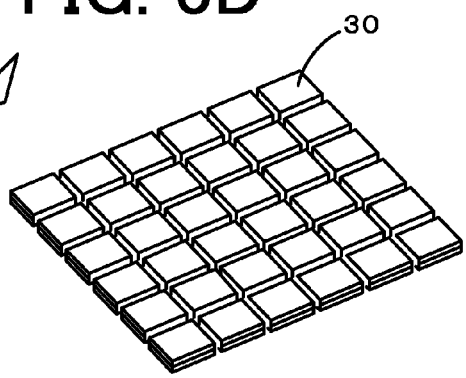

Finally, the composite substrate 10 is diced along the lines between the segments to obtain a large number of semiconductor devices 30 (see FIG. 3D).

According to the embodiment described above, the support substrate 14 includes first and second substrates 14a and 14b made of the same insulating material and bonded together. The support substrate 14 is thus thicker than if the first substrate 14a is used alone as the support substrate 14. This reduces the warpage of the composite substrate 10 due to temperature changes and also increases the strength of the composite substrate 10. After CMOS semiconductor structures and redistribution layers are formed on the semiconductor substrate 12, the second substrate 14b can be separated and removed from the first substrate 14a with a blade. The thickness of the support substrate 14 can thus be easily reduced; therefore, low-profile semiconductor devices can be provided. This results in a lower cost than if the thickness of a bulky support substrate having the same thickness as the support substrate 14 is reduced by backgrinding and therefore results in reduced manufacturing costs of the semiconductor devices 30. The removed second substrate 14b can be reused for the fabrication of another composite substrate 10, which also contributes to reduced cost.

It should be understood that the present invention is not limited to the foregoing embodiment, but may be practiced in various forms within the technical scope of the present invention.

For example, although the first and second substrates 14a and 14b are directly bonded together in the foregoing embodiment, the first and second substrates 14a and 14b may be bonded with an organic adhesive layer therebetween. For example, an organic adhesive (e.g., urethane or epoxy adhesive) is uniformly applied to one or both of the surfaces of the first and second substrates 14a and 14b to be bonded, and the two substrates 14a and 14b are then laminated and bonded together by hardening the organic adhesive. The bonding strength is controlled to a level similar to that in the foregoing embodiment. The advantages of the present invention can also be provided in this way.

EXAMPLES

Example 1

In this example, first and second substrates made of transparent alumina ceramic were bonded together to fabricate a support substrate. The support substrate was bonded to a silicon substrate to fabricate a composite substrate. CMOS semiconductor structures were formed on the silicon substrate. This process will now be described in detail.

Blank substrates made of transparent alumina ceramic were first fabricated by the following procedure. A slurry was prepared by mixing the base powders, dispersion media, gelling agent, dispersant, and catalyst shown in Table 1. The α-alumina powder had a specific surface area of 3.5 to 4.5 $m^2/g$ and an average primary particle size of 0.35 to 0.45 μm. The slurry was casted into an aluminum alloy mold at room temperature and was left standing at room temperature for 1 hour. The slurry was then left standing at 40° C. for 30 minutes to promote solidification and was removed from the mold. The solid was further left standing at room temperature for 2 hours and then at 90° C. for 2 hours to obtain plate-shaped powder compacts. The resulting powder compacts were calcined (preliminary firing) at 1,100° C. in air, were fired at 1,750° C. in an atmosphere containing hydrogen and nitrogen in a ratio (by volume) of 3:1, and were annealed under the same conditions to obtain blank substrates having a diameter of 150 mm and a thickness of 1.0 mm.

TABLE 1

| Base Powder | α-alumina | 100 part by weight |
| | MgO (magnesia) | 0.025 part by weight |
| | $ZrO_2$ (zirconia) | 0.040 part by weight |
| | $Y_2O_3$ (yttria) | 0.0015 part by weight |
| Dispersion Media | glutaric acid dimethyl ester | 27 part by weight |
| | ethylene glycol | 0.3 part by weight |
| Gelling Agent | MDI resin* | 4 part by weight |
| Dispersant | high-moleculer surface-active agent | 3 part by weight |
| Catalyst | N,N-dimethylaminohexanol | 0.1 part by weight |

*MDI is a short name of diphenylmethane diisocyanate.

Two blank substrates were then subjected to high-precision polishing by the following procedure. The blank substrates were first subjected to double-sided lapping with green silicon carbide for shaping and were then subjected to double-sided lapping with diamond slurry. The diamond abrasive grains had a grain size of 3 μm. The blank substrates were polished to thicknesses of 200 μm and 450 μm. The blank substrate polished to a thickness of 200 μm is referred to as "first substrate". The blank substrate polished to a thickness of 450 μm is referred to as "second substrate". One surface of the first substrate was finished to an Ra of less than 1 nm by CMP. The surfaces of the first and second substrates were then cleaned to remove any contaminants therefrom.

The first and second substrates were then directly bonded together by plasma activation to obtain a support substrate. The surface of the first substrate opposite the surface thereof finished by CMP and one surface of the second substrate were first lapped with diamond abrasive grains having a grain size of 3 μm. The surfaces of the first and second substrates were then cleaned to remove any contaminants therefrom and were exposed to an oxygen plasma atmosphere for 50 seconds. The first and second substrates were then laminated together such that the plasma-treated surfaces thereof came into contact with each other and were pressed at the edges thereof to induce self-bonding. A support substrate having a total thickness of 650 μm was obtained.

Measurement of binding energy per unit area by the crack opening method revealed that the binding energy between the first and second substrates was about 0.1 $J/m^2$. The binding energy between the first and second substrates was lower than the bulk strength of silicon, which is typically 2 to 2.5 $J/m^2$. It was demonstrated that the first and second substrates are separable with a blade. The crack opening method is a method for determining the interfacial energy between bonded surfaces from the distance by which a blade is advanced when inserted between laminated substrates. The blade used was Product No. 99077 available from Feather Safety Razor Co., Ltd. (length: about 37 mm, thickness: 0.1 mm, material: stainless steel).

The surface of the support substrate finished by CMP was then directly bonded to a silicon substrate by plasma activation. The silicon substrate was then polished to a thickness of 1 μm, followed by annealing at 200° C. to obtain a composite substrate composed of silicon and transparent alumina. The warpage of the resulting substrate, which had a diameter of 150 mm, was measured to be 50 μm, which is acceptable for semiconductor processes.

CMOS semiconductor structures and redistribution layers were formed on the silicon substrate of the composite substrate. Finally, the first and second substrates of the support substrate were separated from each other with a blade to remove the second substrate. The resulting support substrate had a thickness of 200 μm. It was demonstrated that a support substrate having the desired thickness can be fabricated without backgrinding.

Comparative Example 1

In this comparative example, a single blank substrate made of transparent alumina ceramic was provided as a support substrate and was bonded to a silicon substrate to fabricate a composite substrate. Specifically, a blank substrate made of transparent alumina ceramic and having a diameter of 150 mm and a thickness of 400 μm was first fabricated as in Example 1. The blank substrate was polished to a thickness of 200 μm by lapping and CMP to obtain a support substrate. The support substrate was then directly bonded to a silicon substrate by plasma activation. The silicon substrate was then polished to a thickness of 1 μm, followed by annealing at 200° C. to obtain a composite substrate of Comparative Example 1. The warpage of the resulting substrate, which had a diameter of 150 mm, was measured to be 150 μm, which is much larger than that in Example 1. This level of warpage may lead to pattern misalignment in semiconductor lithography processes.

The present application claims priority from Japanese Patent Application No. 2013-30161 filed on Feb. 19, 2013, the entire contents of which are incorporated herein by reference.

INDUSTRIAL APPLICABILITY

A composite substrate according to the present invention can be used as an SOI substrate or an SOS substrate.

What is claimed is:

1. A composite substrate including a semiconductor substrate and an insulating support substrate that are laminated together, wherein the support substrate includes first and second substrates made of the same insulating material and bonded together with a strength that allows the first and second substrates to be separated from each other with a blade, and the semiconductor substrate is laminated on a surface of the first substrate opposite a surface thereof bonded to the second substrate.

2. The composite substrate according to claim 1, wherein the material for the first and second substrates is one selected from the group consisting of silicon, sapphire, alumina, silicon nitride, aluminum nitride, and silicon carbide.

3. The composite substrate according to claim 1, wherein the material for the first and second substrates is transparent alumina.

4. The composite substrate according to claim 1, wherein the strength that allows the first and second substrates to be separated from each other with a blade is 0.05 to 0.6 J/m$^2$ as expressed in binding energy per unit area of the first and second substrates.

5. A method for manufacturing a semiconductor device including the steps of:
(a) providing the composite substrate according to claim 1;
(b) forming a CMOS semiconductor structure on the semiconductor substrate of the composite substrate;
(c) separating and removing the second substrate from the first substrate with a blade; and
(d) dicing the composite substrate to obtain a semiconductor device.

6. The method for manufacturing a semiconductor device according to claim 5, wherein the step (a) comprises bonding together the first and second substrates with a strength that allows the first and second substrates to be separated from each other with a blade to fabricate the support substrate and then bonding the support substrate to the semiconductor substrate.

7. The semiconductor device manufactured by the method for manufacturing a semiconductor device according to claim 5.

* * * * *